United States Patent [19]

Oberhauser

[11] Patent Number: 5,436,581
[45] Date of Patent: Jul. 25, 1995

[54] CIRCUIT ARRANGEMENT FOR MONITORING THE DRAIN CURRENT OF A METAL OXIDE SEMICONDUCTOR FIELD EFFECT TRANSISTOR

[75] Inventor: Johann Oberhauser, Freising, Germany

[73] Assignee: Texas Instruments Deutschland GmbH, Germany

[21] Appl. No.: 350,750

[22] Filed: Dec. 7, 1994

Related U.S. Application Data

[63] Continuation of Ser. No. 147,187, Nov. 3, 1993, abandoned.

[30] Foreign Application Priority Data

Nov. 3, 1992 [DE] Germany .................. 42 37 122.8

[51] Int. Cl.⁶ .................. H03K 17/60; H03K 3/26
[52] U.S. Cl. .................. 327/50; 327/432; 327/479; 327/427
[58] Field of Search .......... 307/299.2, 350, 495, 307/499, 570, 571, 491, 299.1, 584, 270; 323/315, 316, 317

[56] References Cited

U.S. PATENT DOCUMENTS

| | | | |
|---|---|---|---|
| 4,577,125 | 3/1986 | Allen | 307/455 |
| 4,580,070 | 4/1986 | Westman | 307/350 |
| 4,587,442 | 5/1986 | Gray et al. | 307/350 |
| 5,032,745 | 7/1991 | Izadimi et al. | 307/571 |
| 5,079,448 | 1/1992 | Matsumoto | 307/454 |
| 5,081,379 | 1/1992 | Korteling | 307/350 |
| 5,272,392 | 12/1993 | Wong et al. | 307/299.2 |

FOREIGN PATENT DOCUMENTS 0397102  11/1990  European Pat. Off. .
0386804  12/1990  European Pat. Off. .

*Primary Examiner*—Timothy P. Callahan
*Assistant Examiner*—Toan Tran
*Attorney, Agent, or Firm*—William E. Hiller; Richard L. Donaldson

[57] ABSTRACT

In the case of a circuit arrangement for monitoring the drain current of a metal oxide semiconductor field effect transistor $T_o$ whose effective transistor area is subdivided in order to provide an MOS measuring transistor $T_o'$ and an MOS power transistor $T_o''$ the drain-source paths of the two MOS transistor sections $T_{o'}$, $T_{o''}$ are placed in different current loops $SZ_1$, $SZ_b$ of a current mirror SP1, which is acted upon by a predeterminable reference current $I_{ref}$. The current mirror SP1 has an output terminal E, which supplies a monitoring signal dependent on the difference between the drain-source voltages of the two MOS field effect transistors $T_{o'}$, $T_{o''}$.

10 Claims, 2 Drawing Sheets

CIRCUIT ARRANGEMENT FOR MONITORING THE DRAIN CURRENT OF A METAL OXIDE SEMICONDUCTOR FIELD EFFECT TRANSISTOR

This application is a Continuation of application Ser. No. 08/147,187, filed Nov. 3, 1993, abandoned.

The invention relates to a circuit arrangement for monitoring the drain current of a metal oxide semiconductor (MOS) field effect transistor whose effective transistor area formed on a substrate is subdivided in order to provide an MOS measuring transistor supplying a measuring current and an MOS power transistor supplying a power output.

Such a circuit arrangement is more particularly utilized to detect excessively low currents in a power supply circuit for an electrical load, in which circuit the load is supplied via an MOS power field effect transistor. There is an excessively low current when the respective electrical load is absent or the corresponding leads are defective or, respectively, interrupted. If accordingly an excessively low current lying below a predeterminable limit value is detected, it is possible to conclude that there is a corresponding trouble condition. The limit for the excessively low current may be relatively small and for instance lie in a range of 10 to 100 mA. The power transistors may for instance be provided in an H bridge for the supply of motor or the like. In the case of the transistors it may for instance be more particularly double diffused metal oxide semiconductor field effect transistors (D-MOS-FETs) of the HSD (high side driver) type, whose gate potential is higher than the drain potential when the transistor is turned on.

Monitoring the drain current is relatively problematical in the particular case of D-MOS power transistors. Since when the transistor is turned on the drain-source resistance and consequently furthermore the drain-source voltage is relatively low, it is difficult to measure the respective currents without causing a corresponding transistor drop at series resistances.

In order to avoid the relatively high power dissipation occurring when utilizing such series resistors, there has been a proposal to so subdivide the effective transistor area into two sections that in the major section the current responsible for the power flows and in a smaller section a smaller current flows, which is proportional to the power current. Given an equal voltage drop in the two sections of the transistor the ratio between the two currents is predetermined by the area ratio so that it is possible to calculate the larger power current from the measuring current.

In order to ascertain the smaller current, which is employed for measurement, there has already been a suggestion to connect the two MOS transistor sections with the produced different output terminals of an operational amplifier and to provide such a feedback of the operational amplifier that the source potential of the measuring transistor, provided by the subdivision of the effective transistor area, at all times is equal to the source potential of the power transistor.

A disadvantage in this design is that a regulation circuit is utilized so that overshooting and signal delay is to be expected and this may well lead to erroneous output signals. Furthermore the necessary in-phase input voltage of an operational amplifier is relatively high. Over the entire temperature range it is necessary for the offset voltage to be kept extremely small. For sufficient frequency compensation a relatively large silicon area is necessary. Finally the comparator connected with the output terminal is responsible for further offset problems and for an additional requirement for area to be occupied by it.

One object of the invention is to provide a circuit arrangement of the type initially mentioned, which while having a simple structure and a good response behavior, that is to say more particularly a delay-free response behavior, provides for extremely reliable detection of excessively low currents of metal oxide semiconductor field effect transistors.

In accordance with the invention this aim is to be achieved in that the drain-source paths of the MOS measuring transistor and of the MOS power transistor are placed in different current loops of a current mirror, which is acted upon by a predeterminable reference current and has an output terminal, which supplies a monitoring signal dependent on the difference between the drain-source voltages of the two MOS field effect transistors.

With such a design it is possible not only to achieve an extremely simple form of circuitry, but furthermore it is possible to ensure that even extremely small departures from the permissible limit for the excessively low current are detected reliably and practically without delay. By using a current mirror acted upon by a constant reference current one may be certain of a measuring current which is always equal to this reference current, which simultaneously flows as well in the section, containing the MOS power transistor, of the second current mirror loop. Accordingly there is reproducible or defined voltage in the two current mirror loops, which assume comparable values as soon as the predetermined limit for the excessively low current is reached. In the case of a departure from this limit for the excessively low current, such voltages change as well and accordingly there is a change in the monitoring signal dependent on the difference between them. This monitoring signal is preferably produced on the basis of a comparison between the source voltages of the two transistor sections.

Further advantageous forms of the invention are recited in the dependent claims.

The invention will be described with reference to the following detailed descriptive disclosure of embodiments thereof in conjunction with the drawings.

Figure 1:
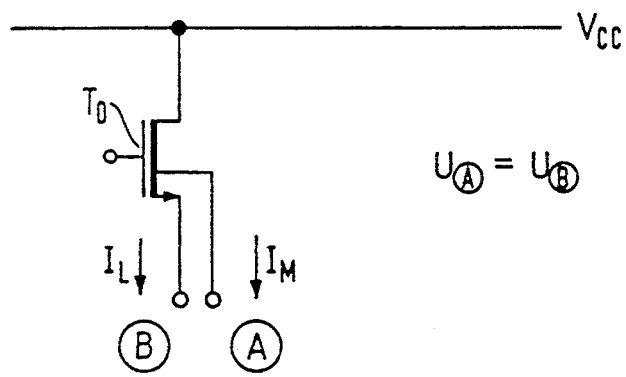
FIG. 1 is a circuit diagram to show the principle of the invention using metal oxide semiconductor field effect transistors divided to constitute the two transistor sections.

FIG. 1 shows the circuit diagram illustrating the principle of a metal oxide semiconductor field effect transistor (MOS-FET) $T_O$, whose effective transistor area formed on a substrate is subdivided into a minor area $A_M$ and a major area $A_L$ in order to constitute an MOS measuring transistor supplying a measuring current $I_M$ and an MOS power transistor, which supplies an output power current $I_L$.

The two transistor sections possess a common drain electrode, to which the supply voltage $V_{cc}$ is fed. On the other hand for the MOS measuring transistor and the MOS power transistor separate source terminals A and, respectively, B are provided to which the source voltages $U_A$ and, respectively, $U_B$ are supplied.

If the source voltage $U_A$ of the MOS measuring transistor is equal to the source voltage $U_B$ of the MOS power transistor, the ratio Q of the two effective areas $A_L$ and $A_M$ Of the transistor sections will correspond to the ratio of the two currents $I_L$ and $I_M$. For $U_A=U_B$ the following equation will hence apply:

$$Q = A_L/A_M = I_L/I_M \quad (1)$$

For $U_A=U_B$ the measuring current $I_M$, which is small in relation to the power current $I_L$, can be calculated from the following equation:

$$I_M = I^L/Q \quad (2)$$

Figure 2:
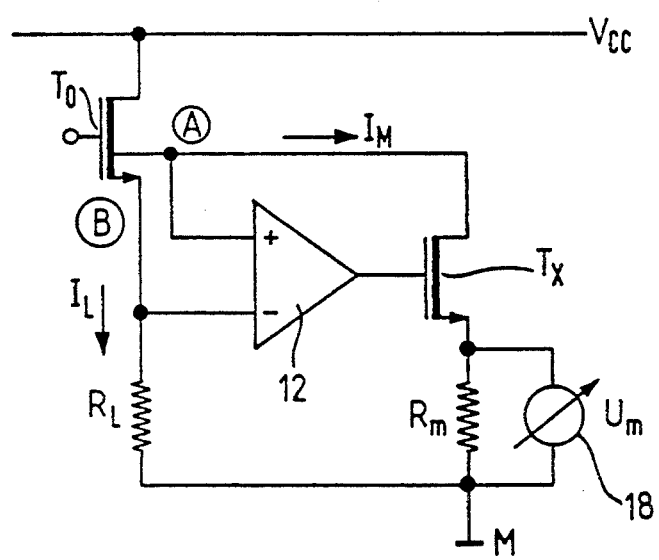
FIG. 2 shows a customary circuit arrangement for the measurement of the measurement current flowing through the one transistors section.

For measurement of the minor current $I_M$ the measuring circuit depicted in FIG. 2 has already been proposed, in the case of which the separate source terminals A and B of the two MOS transistor sections are connected with the positive and, respectively, the negative input terminal of an operational amplifier 12, whose output is fed to the gate electrode of a further metal oxide semiconductor field effect transistor $T_x$, whose drain-source path is connected to be between the source terminal A of the MOS measuring transistor of the divided MOS transistor $T_O$ and an ohmic resistor $R_m$ connected with ground M. The source terminal B, connected with the negative output terminal of the operational amplifier 12, of the MOS power transistor is connected via a load resistor $R_L$ with ground M. The measuring current $I_M$ flows through the further MOS transistor $T_x$ and the measuring resistor $R_m$ connected therewith in series. The drop in the measuring voltage $U_m$ across the measuring resistor $R_m$ is measured via a voltage measuring means 18.

In the case of this circuit the operational amplifier 12 has such a feedback that the source terminal A is at virtually the same potential as the source terminal B with the result that the relation (1) is always fulfilled and the output power current $I_L$ can be computed from the equation (2) as soon as the measuring current $I_M$ has been ascertained on the basis of the measuring voltage $U_m$ using the relationship $I_M = U_m \cdot R_m$.

It is a disadvantage in the case of this previously proposed circuit however that a regulation circuit is present which may lead to overshooting and to signal delays and consequently errors in the output signals. For the operational amplifier it is necessary to have a relatively high in-phase input voltage which is essentially equal to the supply voltage. For the entire temperature range of interest it is necessary to ensure that the offset voltages remain small. For the necessary frequency compensation a large silicon area is necessary. The comparator provided for the circuit involves further offset problems and leads to a larger area being required.

Figure 3:
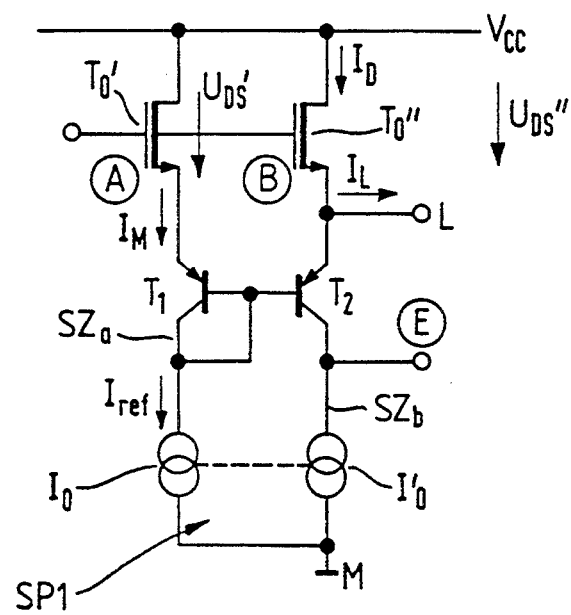
FIG. 3 is a circuit diagram to show the principle of the circuit arrangement for the monitoring of the drain current of a metal oxide semiconductor field effective transistor.

In FIG. 3 the basic principle of the circuit arrangement in accordance with the invention for monitoring the drain current $I_{DS}$ of a metal oxide semiconductor field effect transistor $T_O$ is illustrated, in the case of which it is more particularly a question of a double diffused MOS (D-MOS) transistor of the HSD (high side driver) type, in which the gate electrode in the turned on condition of the transistor has a higher potential than the drain electrode. The circuit arrangement in accordance with the invention is however able to be utilized in conjunction with other MOS transistors which for instance may be of the P type channel type.

The effective transistor area formed on a substrate is subdivided in order to constitute an MOS measuring transistor $T_O'$ supplying a measuring current $I_M$ and an MOS power transistor $T_O''$ which supplies a higher current $I_L$ for the output power.

The two MOS transistor sections $T_O'$ and $T_O''$ possess a common drain electrode, to which the supply voltage $V_{cc}$ is fed. Furthermore the gate electrodes of the two MOS transistor sections $T_O'$ and $T_O''$ are connected with one another or, respectively, constituted by a common gate electrode.

Owing to the division made of the effective transistor area the two MOS transistor sections $T_O'$ and $T_O''$ have separate source terminals A and, respectively, B.

The drain source paths D-S of the MOS transistor section $T_O'$ and of the MOS power transistor $T_O''$ are arranged in different current paths $SZ_a$ and $SZ_b$ of a current mirror SP1. The input current path $SZ_a$ of such current mirror SP1 is for example fed with a constant reference current $I_{ref}$ using a constant current source $I_o$, such reference current being reflected in the second current path $SZ_b$.

The current mirror SP1 comprises two transistors $T_1$ and $T_2$, which in the illustrated working embodiment are bipolar transistors, whose bases are connected with one another and whose emitter-collector paths arranged in the respective current path $SZ_a$ and, respectively, $SZ_b$ are connected with the measuring transistor $T_O'$ and, respectively, the power transistor $T_O''$ in series. In order to constitute a transistor diode the base of the transistor $T_1$ is connected with the collector thereof.

In the illustrated working embodiment of the invention bipolar pnp transistors $T_1$ and $T_2$ are employed, whose emitters are connected with the respective source terminal A and B of the measuring transistor $T_O$ or, respectively, the power transistor $T_O'$. The collectors of the two transistors $T_1$ and $T_2$ are connected by the intermediary of the constant current source $I_o$ and, respectively, the constant current source $I'_o$, which is obtained by the mirror effect and supplies the same current, with ground M.

At the junction between the emitter of the transistor $T_2$ and the source terminal B of the MOS power transistor $T_O''$ a power output terminal L is provided, via which the current $I_L$ relevant for the output power is tapped. The collector of the transistor $T_2$ is provided with a monitoring output terminal E, which supplies a monitoring signal, which is dependent on the difference between the source voltages at the source terminals A and B of the two MOS transistors $T_O'$ and, respectively, $T_O''$ and therefore on the difference between their drain-source voltages $U_{DS'}$ and $U_{DS''}$.

The manner of operation of the circuit in accordance with the invention is as follows:

Owing to the current mirror SP1 the transistor $T_2$ in the current path $SZ_b$ has the same collector current as the transistor $T_1$ in the current path $SZ_a$, these two currents always being equal to the predetermined reference current $I_{ref}$, which for its part is equal to the measuring current $I_M$ flowing through the MOS measuring transistor $T_O'$. If it is assumed that the two MOS transistor sections $T_O'$ and $T_O''$ have been produced by a division of the effective transistor area in accordance with ratio Q (see equation 1), then when the MOS transistor $T_O$ is turned on as an equivalent for the MOS measuring transistor $T_{O'}$ there will be a measuring resistance $R_M$, which is proportional to the drain-source resistance $R_{DS}$ on the MOS power transistor $T_{O''}$, the proportionality factor again being Q. The MOS power transistor $T_{O''}$ acts as a voltage source with the voltage $U_{DS''}=I_L$ and the internal resistor $R_i$ equal to $R_{DSon}$.

If not the current $I_L$ of the output power fulfills the relationship $$I_L = Q \cdot I_{ref} \quad (3)$$

then the voltages $U_A$ and, respectively, $U_B$ occurring at the two source terminals A and B will be the same in size. If this condition $$U_A = U_B \quad (4)$$

is complied with, the desired excessively low current limit or threshold will have been reached. This will be signaled by a corresponding monitoring signal at the monitoring output terminal E, those potential in this case will be substantially equal to the collector potential of the transistor $T_1$ the to transistors $T_1$ and $T_2$ are suitably matched.

It is not necessary for the two source potentials to be kept equal to each other. It is only necessary to recognize then this event occurs.

If the current $Z_L$ for the output power is below the value $Q \cdot I_{ref}$, we will then have $$U_B > U_A \quad (5)$$

or, respectively, $$U_{BE}(T_2) > U_{BE}(T_1) \quad (6).$$

This means at the same time that the potential at the monitoring output terminal E is increased in relation to the collector potential of the transistor $T_1$. A higher level of the monitoring signal present at the output terminal E consequently means the presence of an excessively low current or, respectively a trouble condition, which owing to the device in accordance with the circuit arrangement in accordance with invention is therefore directly and reliably detected.

If on the other hand the current $I_L$ of the output power assumes a value which is greater than $Q \cdot I_{ref}$, this will mean that the voltage present at the source terminal B of the MOS power transistor $T_{O''}$ is less than the voltage present at the source terminal A of the MOS measuring transistor, i. e. there is the relationship $$U_B < U_A \quad (7)$$

This means simultaneously that the base emitter voltage at the transistor T2 is smaller than the basis-emitter voltage at the transistor T1, that is to say:

$$U_{BE}(T_2) < U_{BE}(T_1) \quad (8)$$

Since the transistors $T_1$ and $T_2$ in the present case are pnp transistors, the voltage values quoted in the equations (5) and (8) are respectively to be thought of as absolute values.

If now the base-emitter voltage of the transistor T2 becomes smaller in amount, the potential at the monitoring output terminal E will also fall to a correspondingly lower value so that a smaller voltage level at the monitoring output terminal E will signal that the respective limit for excessively low current has been exceeded and it is not a question of there being an excessively low current.

Figure 4:
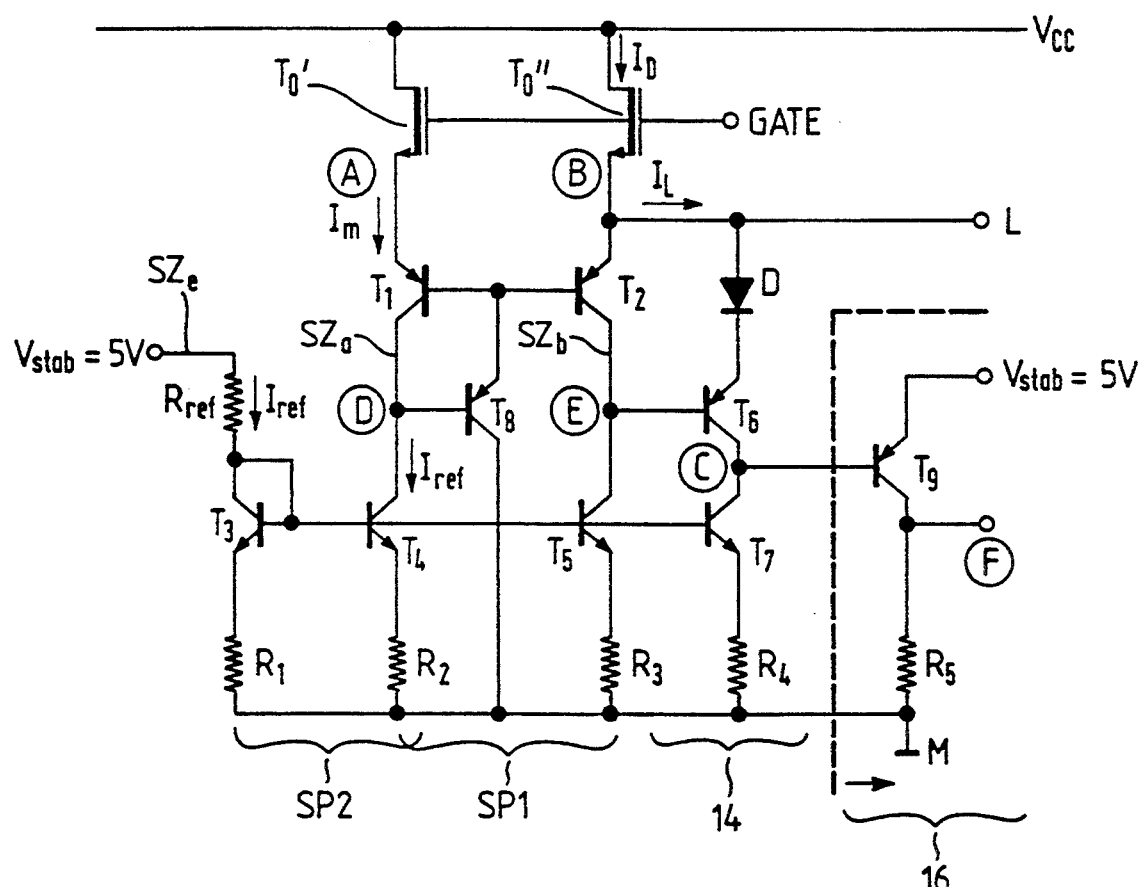
FIG. 4 shows a possible modification of the circuit arrangement in accordance with the invention.

In FIG. 4 a convenient practical modification of the invention will be seen which operates on the same principle as the simplified circuit arrangement in accordance with FIG. 3.

In this case the MOS measuring transistor $T_{O'}$ and the MOS power transistor $T_{O''}$ are arranged in the respective current mirror loops $SZ_a$ and $SZ_b$ of the current mirror in each case in series with two mutually complementary transistors $T_1$, $T_4$ and, respectively, $T_2$ and $T_5$ whose collectors are connected together. Whereas the npn transistors $T_1$ and $T_2$ are connected via their emitters respectively with the source terminals A and B of the MOS measuring transistor $T_{O'}$ and, respectively, of the MOS power transistor $T_{O''}$, the pnp transistors $T_4$ and $T_5$ are respectively connected via an emitter resistor $R_2$ and $R_3$ with ground. The bases of the two transistors $T_4$ and $T_5$ are also connected with one another like the bases of the two transistors $T_1$ and $T_2$. The base terminal of a further pnp transistor $T_8$ is connected with the two collectors of the transistors $T_1$ and $T_4$ and via the emitter terminal thereof with the bases of the transistors $T_1$ and $T_2$. The collector of this transistor $T_8$ is directly connected with ground M.

The current mirror SP1 comprising the two MOS field effect transistors $T_{O'}$ and $T_{O''}$ is supplied with the predeterminable reference current $I_{ref}$ via a further current mirror SP2, which comprises an output current path $SZ_e$ connected with a stabilized input constant voltage $V_{stab}$, in which path a reference resistor $R_{ref}$ is comprised in series with a transistor diode $T_3$, which is for its part is connected via an emitter resistor $R_1$ with ground M. The base of the npn transistor $T_3$ constituting the transistor diode is connected with the base of the transistor $T_4$.

This ensures that in the current mirror paths $SZ_a$ and $SZ_b$ comprising the two transistors $T_1$ and $t_2$ the same constant reference current $I_{ref}$ is flowing at all times which is produced in the input path $SZ_e$ in a manner dependent on the stabilized voltage $V_{stab}$ and the reference resistor $R_{ref}$.

In the case of this working embodiment depicted in FIG. 4 the monitoring output terminal E of the current mirror SP1 is constituted by the two collectors, which are connected together, of the two complementary transistors $T_2$ and $T_5$ of the current mirror $SZ_b$.

Following this monitoring output terminal E of the current mirror SP1 there is an output stage 14 comprising two mutually complementary transistors $T_6$ and $T_7$. While the base of the transistor $T_6$ is connected with the monitoring output terminal E of the current mirror SP1, the base of the transistor $T_7$ is for its part connected with the bases of the transistors $T_3$ and $T_5$ and while the emitter of the transistor $T_6$ is connected via a diode D with the power output L, the transistor $T_7$ is connected via an emitter resistor $R_4$ with ground M. The output signal of this output stage 14 is tapped at a connection C, which is constituted by the two linked collectors of the two transistors $T_6$ and $T_7$.

Lastly it is possible furthermore for the output terminal C of the output stage 14 to be followed by a TTL level matching stage 16, via which the output level may be adapted to the TTL level for a following TTL circuit.

In the case of the present working embodiment this TTL level adapting stage 16 comprises a pnp transistor T9, whose base is connected with the output terminal C of the stage 14 and whose emitter is connected with the positive potential $V_{stab}$ of a stabilized voltage source, whereas its collector is connected via a resistor $R_5$ with ground M. The output signal of this TTL level adaptation stage 16 is take off at a connection F, which is connected with the collector of the transistor T9.

The manner of operation of this circuit arrangement is essentially the same as that of the circuit described with reference to FIG. 3. On reaching the excessively low current limit or, respectively, the switch limit, at the monitoring output terminal E of the voltage mirror SP1 there will be essentially the same potential as at the junction D between the two collectors, which are connected with each other, of the transistors $T_1$ and $T_4$. As long as the excessively low current limit is gone below, the terminal E will have a high level so that via the output stage 14 and the transistor T9, the potential of the TTL level adaptation stage 16 will also be correspondingly raised at the output terminal F. A high output level at the output terminal F will again indicate an excessively low current, that is to say a trouble condition.

The emitter resistors $R_1$ through $R_3$ serve to compensate for mismatch of the selected transistors $T_3$ through $T_5$ of the current mirrors SP1 and SP2. Moreover such resistors provide for a substantially higher gain and the effects of early voltage of the said transistors are reduced to a minimum. Since the potentials D and E are substantially equal in size in the case of reaching the switch limit or, respectively, the excessively low current limit, the effect of the early currents of the transistors $T_1$ and $T_2$ is practically dealt with completely. The effect of any offset voltage occurring in connection with mismatch of the base-emitter voltages of the transistors $T_1$ and $T_2$ may be reduced by suitable layout techniques. In the illustrated practical working embodiment of the invention this offset voltage is less than 0.5 mV.

The circuit arrangement in accordance with the invention may with advantage be employed for the monitoring of the drain current of double diffused MOS (D-MOS) field effect transistors, which more particularly may be of the HSD (high side driver) type. Such D-MOS field effect transistors may for example be provided in an H bridge for the supply of a motor or another electrical load.

In the case of the illustrated working embodiments of the circuit arrangement in accordance with the invention a reference current is consequently employed to produce a reference voltage at the source terminal A of the MOS field effect transistor $T_O'$, with which voltage the voltage at the source terminal B of the MOS power transistor $T_O''$ is compared. Owing to this comparison it is possible to exactly detect the transition from current values below the excessively low current value or switch limit at current values above such limit very exactly and to precisely set the switching point. The circuit arrangement in accordance with the invention is furthermore characterized by a simple and inexpensive circuitry, low sensitivity as regards changes In the supply voltage, a low temperature coefficient and an optimum response behavior.

I claim:
1. A circuit arrangement for monitoring the drain current ($I_{DS}$) of a metal oxide semiconductor field effect (MOS) transistor ($T_O$) whose effective transistor area formed on a substrate is subdivided in order to provide an MOS measuring transistor ($T_O'$) supplying a measuring current ($I_M$) and an MOS power transistor ($T_O''$) supplying a power output, characterized in that the drain-source paths (D - S) of the MOS measuring transistor ($T_O'$) and of the MOS power transistor ($T_O''$) are placed in different current loops ($SZ_a$, $SZ_b$) of a current mirror (SP1), which is acted upon by a predeterminable reference current ($I_{ref}$) and has an output terminal (E), which supplies a monitoring signal dependent on the difference between the drain-source voltages ($U_{DS}$) of the two MOS field effect transistors ($T_O'$, $T_O''$).

2. The circuit arrangement as claimed in claim 1, characterized in that the predeterminable reference current ($I_{ref}$) is fed to the current mirror (SP1) comprising the two MOS field effect transistors ($T_O'$, $T_O''$).

3. The circuit arrangement as claimed in claim 1, characterized in that the MOS measuring transistor ($T_O'$) and the MOS power transistor ($T_O''$) in the respective current mirror loop ($SZ_a$, $SZ_b$) are each connected in series with a transistor ($T_4$, $T_5$) which is connected via an emitter resistor ($R_2$, $R_3$) with ground.

4. The circuit arrangement as claimed in claim 1, characterized in that in the respective current mirror loop ($SZ_a$, $SZ_b$) the MOS measuring transistor ($T_O'$) and the MOS power transistor ($T_O''$) are each connected in series with two mutually complementary transistors ($T_1$, $T_4$; $T_2$, $T_5$).

5. The circuit arrangement as claimed in claim 4, Characterized in that the monitoring output terminal (E) of the current mirror (SP1) is constituted by the two collectors, which are connected with one another, of the two complementary transistors ($T_2$, $T_5$) in the current mirror loop ($SZ_b$) containing the MOS power transistor ($T_O''$).

6. The circuit arrangement as claimed in claim 5, characterized in that an output stage (14) comprising two mutually complementary transistors ($T_6$, $T_7$) is connected to the monitoring output terminal (E) of the current mirror (SP1).

7. The circuit arrangement as claimed in claim 1, characterized in that the current mirror (SP1) having the monitoring output terminal (E) is connected to an output stage (14) which is connected with a following TTL level adapting stage (16).

8. The circuit arrangement as claimed in claim 2, characterized in that a further current mirror (SP2) comprises an input current loop ($SZ_e$) connected with a constant voltage ($V_{stab}$), in which a reference resistor ($R_{ref}$) is connected in series with a transistor diode ($T_3$), which is connected via an emitter resistor (R1) with ground (M); wherein the further current mirror controls the predetermined reference current.

9. The circuit arrangement as claimed in claim 1, characterized in that the metal oxide semiconductor field effect transistor ($T_O$) is a double diffused MOS (D-MOS) transistor.

10. The circuit arrangement as claimed in claim 9, characterized in that the metal oxide semiconductor field effect transistor ($T_O$) is a D-MOS transistor of the HSD (high side driver) type, in the case of which in the turned on state of the transistor the gate electrode has a higher potential than the drain electrode.

* * * * *